(12) United States Patent
Lee et al.

(10) Patent No.: US 8,486,857 B2
(45) Date of Patent: Jul. 16, 2013

(54) DONOR SUBSTRATE FOR LASER INDUCED THERMAL IMAGING AND METHOD OF FABRICATING ORGANIC LIGHT EMITTING DIODE USING THE SAME

(75) Inventors: Seung-Mook Lee, Yongin (KR); Jin-Woo Park, Yongin (KR); Sang-Woo Pyo, Yongin (KR); Myung-Jong Jung, Yongin (KR); Do-Young Kim, Yongin (KR); Dae-Hoon Kim, Yongin (KR); Hyo-Yeon Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 961 days.

(21) Appl. No.: 12/461,870

(22) Filed: Aug. 26, 2009

(65) Prior Publication Data
US 2010/0055343 A1    Mar. 4, 2010

(30) Foreign Application Priority Data

Aug. 26, 2008  (KR) ................. 10-2008-0083345

(51) Int. Cl.
*B41M 5/34*    (2006.01)
(52) U.S. Cl.
USPC .............. 503/227; 428/32.77; 428/32.81; 430/945

(58) Field of Classification Search
None
See application file for complete search history.

(56) References Cited

U.S. PATENT DOCUMENTS

| 6,853,133 B2 | 2/2005 | Liao et al. |
| 6,989,288 B2 | 1/2006 | Suh et al. |

FOREIGN PATENT DOCUMENTS

| KR | 20060023056 A | 3/2006 |
| KR | 10-2007-0067725 | 6/2007 |
| KR | 10-0731755 | 6/2007 |
| KR | 10-0796594 | 1/2008 |
| KR | 0832095 B1 | 5/2008 |

*Primary Examiner* — Bruce H Hess
(74) *Attorney, Agent, or Firm* — Robert E. Bushnell, Esq.

(57) ABSTRACT

Provided are a donor substrate for laser induced thermal imaging (LITI) and a method of fabricating an organic light emitting diode (OLED) using the same, which can prevent a transferred emission layer from being damaged by heat and thus prevent wrinkles from forming on the surface thereof. The donor substrate includes a base layer, a light-to-heat conversion layer disposed on the base layer, a first transfer layer disposed on the light-to-heat conversion layer and including an organic layer, an inorganic layer, or a double layer thereof, and a second transfer layer disposed on the first transfer layer and including an emission layer. The first transfer layer has an absolute value of lowest unoccupied molecular orbital energy level of 2.6 to 3.0 eV and a band gap energy of 2.8 to 3.4 eV.

16 Claims, 4 Drawing Sheets

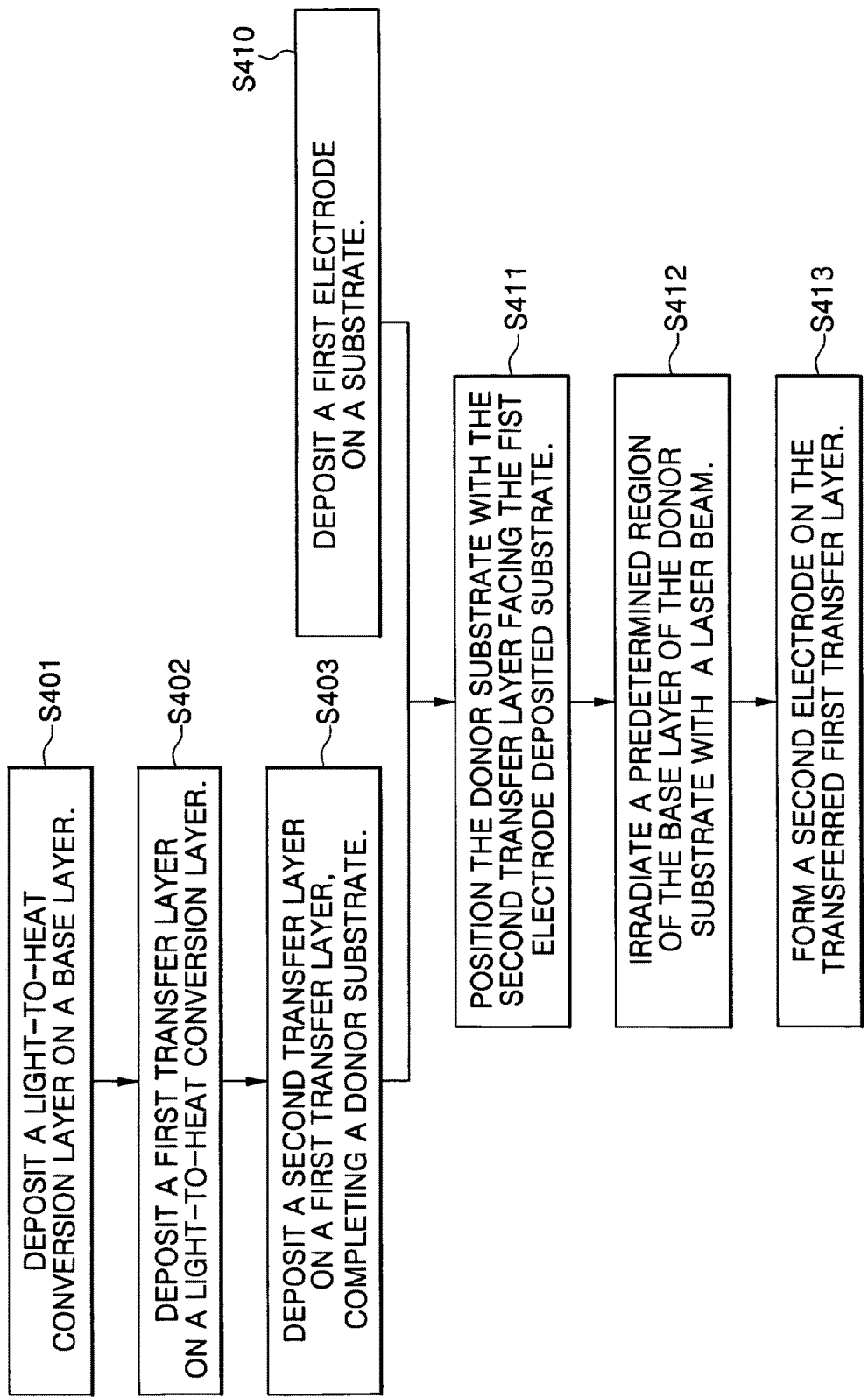

DONOR SUBSTRATE FOR LASER INDUCED THERMAL IMAGING AND METHOD OF FABRICATING ORGANIC LIGHT EMITTING DIODE USING THE SAME

CLAIM OF PRIORITY

This application makes reference to, incorporates the same herein, and claims all benefits accruing under 35 U.S.C. §119 from an application earlier filed in the Korean Intellectual Property Office on 26 Aug. 2008 and there duly assigned Serial No. 10-2008-0083345.

BACKGROUND OF THE INVENTION

1. Field of the Invention

The present invention relates to a donor substrate for laser induced thermal imaging (LITI) and a method of fabricating an organic light emitting diode (OLED) using the same, and more particularly, to a donor substrate for laser induced thermal imaging (LITI) and a method of fabricating an OLED using the same. The OLED and the method of fabricating the OLED of the present invention prevent a transferred emission layer from being damaged by heat and thus prevent wrinkles from forming on the surface thereof.

2. Description of Related Art

Among flat panel displays (FPDs), an organic light emitting diode (OLED) display has the advantages of self-emissive, wide viewing angle, rapid response time, small thickness, low manufacturing cost, high contrast, and the like. For these reasons, the OLED display has attracted much attention as the next-generation flat panel display device.

In general, the OLED includes several layers such as a hole injection layer, a hole transport layer, an organic emission layer, an electron transport layer, an electron injection layer, and the like, which are interposed between an anode and a cathode. A full color display can be realized by patterning emission layers for representing three primary colors of red (R), green (G) and blue (B) on the OLED.

A multi-layered organic layer may be formed by vacuum deposition using a shadow mask or by conventional photolithography. However, in the case of vacuum deposition, there is a difficulty in forming the organic layer into a highly precise pattern, and thus manufacture of a perfect full color display is difficult. Moreover, in the case of photolithography, there is a problem in that the organic layer may be damaged by a developing solution or an etching solution, which results in deterioration of luminous efficiency and lifetime.

Accordingly, a method of patterning the organic layer by laser induced thermal imaging (LITI) has been introduced to solve such problems.

LITI is a method of forming a pattern by transferring a material for forming the pattern onto an acceptor substrate using a laser beam emitted from a laser source. To perform such a method, a donor substrate onto which a transfer layer is formed, a laser source, and an acceptor substrate are required.

The donor substrate includes a base layer, a light-to-heat conversion layer, and a transfer layer including an emission layer. In a transfer process using the donor substrate, when a laser beam is applied onto a predetermined region of the base layer, energy of the laser beam is converted into heat in the light-to-heat conversion layer, and the heat changes the adhesion between the transfer layer and the light-to-heat conversion layer so that a predetermined region of the transfer layer is transferred onto the acceptor substrate.

In the contemporary method of forming the emission layer of the OLED using the donor substrate for LITI, the transfer layer including the emission layer is formed on the light-to-heat conversion layer, and the transfer layer is transferred onto the acceptor substrate by applying the laser beam. In this case, there is a problem in that the emission layer included in the transfer layer is damaged by heat and thus wrinkles are formed on the surface of the transferred emission layer, and interface characteristics deteriorate. Moreover, there is a problem in that, since transfer characteristics vary according to the kind of material used to form the emission layer, the thickness or properties of the emission layer may be changed after transfer, even if the same laser beam is applied.

SUMMARY OF THE INVENTION

The present invention provides a donor substrate for laser induced thermal imaging (LITI) and a method of fabricating an organic light emitting diode (OLED) using the same, which can prevent a transferred emission layer from being damaged by heat so that no wrinkles are formed on the surface of the emission layer, and which can control the difference in transfer characteristics according to the kind of material used to form the emission layer so that it is possible to select various materials used to form the emission layer.

In the present invention, the damage is prevented by forming a first transfer layer or a buffer layer between an emission layer and a light-to-heat conversion layer. The first transfer layer or the buffer layer is formed of an organic layer, an inorganic layer, or a double layer thereof. The first transfer layer or the buffer layer has an absolute value of lowest unoccupied molecular orbital (LUMO) energy level of 2.6 eV to 3.0 eV and a band gap energy of 2.8 eV to 3.4 eV. Moreover, because the difference in transfer characteristics depending on the kind of material used to form the emission layer is controlled by the first transfer layer or the buffer layer, it is possible to select various materials used to form the emission layer.

According to an embodiment of the present invention, a donor substrate for laser induced thermal imaging includes: a base layer; a light-to-heat conversion layer disposed on the base layer; a first transfer layer disposed on the light-to-heat conversion layer, and a second transfer layer disposed on the first transfer layer and including an emission layer. The first transfer layer includes an organic layer, an inorganic layer, or a double layer thereof. The first transfer layer has an absolute value of lowest unoccupied molecular orbital energy level of 2.6 to 3.0 eV and a band gap energy of 2.8 to 3.4 eV.

According to another embodiment of the present invention, a donor substrate for laser induced thermal imaging includes: a base layer; a light-to-heat conversion layer disposed on the base layer; a buffer layer disposed on the light-to-heat conversion layer, and a transfer layer disposed on the buffer layer and including an emission layer. The buffer layer includes an organic layer, an inorganic layer, or a double layer thereof. The buffer layer has an absolute value of lowest unoccupied molecular orbital energy level of 2.6 to 3.0 eV and a band gap energy of 2.8 to 3.4 eV.

According to still another embodiment of the present invention, a method of fabricating an organic light emitting diode includes: providing a substrate on which a first electrode is formed; positioning a donor substrate, which includes a base layer, a light-to-heat conversion layer disposed on the base layer, a first transfer layer disposed on the light-to-heat conversion layer, and a second transfer layer disposed on the first transfer layer; irradiating a predetermined region of the base layer of the donor substrate with a laser beam to transfer a predetermined region of the first transfer layer and a predetermined region of the second transfer layer, which are formed on the predetermined region of the base layer, onto the substrate; and forming a second electrode on the transferred first transfer layer. The first transfer layer includes an organic layer, an inorganic layer, or a double layer thereof. The first transfer layer has an absolute value of lowest unoccupied molecular orbital energy level of 2.6 to 3.0 eV and a band gap energy of 2.8 to 3.4 eV. The second transfer layer includes an emission layer. The second transfer layer faces the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 4 is a flowchart showing the steps of the fabricating a donor substrate and steps of transferring a first transfer layer of the donor substrate onto a first electrode-formed substrate according to the present invention.

DETAILED DESCRIPTION OF EXEMPLARY EMBODIMENTS

Figure 1:
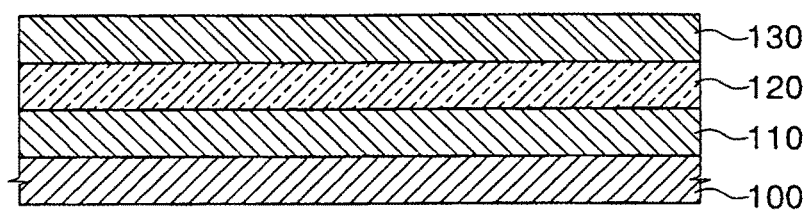
FIG. 1 is a cross-sectional view of a donor substrate for laser induced thermal imaging (LITI) according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of a donor substrate for laser induced thermal imaging (LITI) according to an exemplary embodiment of the present invention.

Referring to FIG. 1, a base layer 100 is provided. The base layer 100 may be formed of a transparent polymer material or glass to transmit light to a light-to-heat conversion layer. The transparent polymer material may be at least one polymer material selected from the group consisting of polyester such as polyethylene terephthalate (PET), polyacryl, polyepoxy, polyethylene, and polystyrene. Preferably, the base layer 100 may be polyethylene terephthalate (PET). Preferably, the base layer 100 is formed of a material having a sufficient mechanical strength as a support substrate.

Subsequently, a light-to-heat conversion layer 110 is disposed on the base layer 100. The light-to-heat conversion layer 110 absorbs a laser beam and converts a part of the energy of the laser beam into heat. The light-to-heat conversion layer 110 may be a metal that can absorb light in infrared ray to visible ray region, an oxide or sulfide of the metal, an organic polymer layer including an infrared dye such as carbon black or graphite as a light absorbing material, or a multilayer thereof. Preferably, the metal is aluminum (Al) or silver (Ag).

In this case, it is preferable that the optical density of the light-to-heat conversion layer 110 is less than 2.0. In the case where the optical density is less than 2.0, it is possible to effectively prevent a transfer layer from being damaged by energy passing through the light-to-heat conversion layer 110 and transmitted to the transfer layer. In the case where the light-to-heat conversion layer 110 is a metal layer, it can be formed by vacuum deposition, electron beam deposition, or sputtering and may have a thickness of 100 to 5,000 Å. In the case where the light-to-heat conversion layer 110 is an organic polymer layer, it can be formed by a conventional film coating method such as gravure, extrusion, spin coating, or knife coating and may have a thickness of 0.1 to 2 μm.

Subsequently, a first transfer layer 120, which is formed of an organic layer, an inorganic layer, or a double layer of an organic layer and an inorganic layer, is disposed on the light-to-heat conversion layer 110. The first transfer layer 120 has an absolute value of lowest unoccupied molecular orbital (LUMO) energy level of 2.6 to 3.0 eV and a band gap energy of 2.8 to 3.4 eV. Since the organic layer or the inorganic layer, which has an absolute value of LUMO energy level of 2.6 to 3.0 eV and a band gap energy of 2.8 to 3.4 eV, is a material having a large steric hindrance, a conglomerate phenomenon does not occur during transfer and it is thermally stable. Therefore, no wrinkles are formed on the interface between the light-to-heat conversion layer 110 and the first transfer layer 120, and the interface between the first transfer layer 120 and the emission layer after transfer. As a result, since no wrinkles are formed on the interface of the transferred emission layer, it is possible to improve interface characteristics of the transferred emission layer, and to prevent the emission layer from being damaged by heat during the transfer process.

Preferably, the first transfer layer 120 is formed of an organic light emitting host material having an absolute value of LUMO energy level of 2.6 to 3.0 eV and a band gap energy of 2.8 to 3.4 eV. In particular, it is preferable that a blue light emitting host material is selected according to the interface characteristics with the emission layer during transfer and the matching of the energy level with the emission layer in the OLED after transfer. An organic light emitting host material is a material that can be formed into a film by itself since its film formability is high, although its light emitting capability is low. On the contrary, an organic light emitting dopant material is a material that cannot be formed into a film by itself, although its light emitting capability is high. In this case, it is preferable that the first transfer layer 120 does not include the organic light emitting dopant material, since the organic light emitting dopant material has a thermal stability and charge transfer mobility lower than those of the organic light emitting host material.

The organic light emitting host material may be selected from contemporarily known host materials. For example, the organic light emitting host material may be one selected from the group consisting of 4,4'-bis(2,2'-diphenylvinyl)-1,1'-biphenyl (DPVB), spiro-DPVB, distyrylarylene (DSA), distyrylarylene derivatives, distyrylbenzene (DSB), distyrylbenzene derivatives, carbazole derivatives, triarylamine derivatives, BH013, BH215, BH232, BH 140 (manufactured by Idemitsu), and TC1558 (manufactured by Tetrahedron).

In the case where the first transfer layer 120 is formed of an organic material, it may have a thickness of 30 to 300 Å. If the thickness of the first transfer layer 120 is less than 30 Å, the effect of improving the surface of the emission layer due to the first transfer layer 120 may not be significant and, since the thickness of less than 30 Å is a molecular level, it may be difficult to form a thin film with a uniform thickness. Whereas, if the thickness of the first transfer layer 120 exceeds 300 Å, the driving voltage may be increased in the OLED when the first transfer layer 120 is transferred onto the OLED. In the case where the first transfer layer 120 is formed of an inorganic layer or a double layer having an inorganic layer, it is preferable that the first transfer layer 120 has a thickness of 30 to 50 Å. In the case where the first transfer layer 120 is formed of an inorganic layer, it may have a thickness less than 50 Å so as to efficiently transfer electric charges by a tunneling phenomenon occurring when the first transfer layer 120 is transferred onto the OLED.

The first transfer layer 120 may be formed by thermal vacuum deposition, vapor phase deposition, spin coating, dip coating, doctor blading, or inkjet printing.

Subsequently, a second transfer layer 130 including an emission layer is disposed on the first transfer layer 120. The second transfer layer 130 may be an emission layer of the OLED. In this case, the second transfer layer 130 may be formed by doping a small amount of organic light emitting dopant material into the organic light emitting host material. The organic light emitting host material and the organic light emitting dopant material may be selected from host materials and dopant materials, which are well known in the art.

Examples of the organic light emitting host materials may include 4,4'-N,N'-dicarbazole-biphenyl (CBP), bis(2-methyl-8-quinolinato)-4-phenylphenolate aluminum (BAlq), 2,9-dimethyl-4,7-diphenyl-1,10-phenanthroline BCP), N,N'-dicarbazolyl-1,4-dimethene-benzene (DCB), rubrene, distyrylarylene derivatives, oxadiazole derivatives, anthracene derivatives, and the like. Examples of the organic light emitting dopant materials may include fluorescent dopants and phosphorescent dopants. The fluorescent dopants may include distyrylamine derivatives, pyrene derivatives, perylene derivatives, distyrylbiphenyl (DSBP) derivatives, 10-(1,3-benzothiazol-2-yl)-1,1,7,7-tetramethyl-2,3,6,7-tetrahydro-1H,5H,11H-pyrano(2,3-f)pyrido(3,2,1-ij)quinolin-11-one (C545T), quinacridone derivatives, 4-(dicyanomethylene)-2-tert-butyl-6-(1,1,7,7-tetramethyljulolidyl-9-enyl)-4H-pyran (DCJTB), 4-(dicyanomethylene)-2-methyl-6-(p-dimethylaminostyryl)-4H-pyran (DCM), and the like. Meanwhile, the phosphorescent dopants may include bis(3,5-difluoro-2-(2-pyridyl)phenyl-(2-carboxypyridyl)iridium ($F_2$Irpic), ($F_2$ppy)$_2$Ir(tmd), tris(2-phenylpyridine)iridium(III) (Ir (PPy)$_3$), PQIr, Btp$_2$Ir(acac), 2,3,7,8,12,13,17,18-octaethyl-21H,23H-porphyrin-platinium(II) (PtOEP), Ir(piq)$_2$(acac), and the like.

The second transfer layer 130 may further include at least one of a hole injection layer, a hole transport layer, an electron blocking layer, a hole blocking layer, an electron transport layer, and an electron injection layer, in addition to the emission layer. The materials that form the above layers may be selected from conventionally known materials.

For example, the hole injection layer may be formed of an arylamine compound, a phthalocyanine compound, or a starburst type amine. In more detail, the hole injection layer may be formed of 4,4,4-tris(3-methylphenyl(phenyl)amino)triphenylamine (m-MTDATA), 1,3,5-tris[4-(3-methylphenyl (phenyl)amino)phenyl]benzene (m-MTDATB), or copper phthalocyanine (CuPc). The hole transport layer may be formed of an arylene diamine derivative, a starburst type compound, a biphenyldiamine derivative having a spiro group, or a ladder type compound. In more detail, the hole transport layer may be formed of N,N'-diphenyl-N,N'-bis(3-methylphenyl)-1,1'-biphenyl-4,4'-diamine (TPD), N,N'-di (naphthalene-1-yl)-N,N'-diphenyl-benzidine (α-NPD), or 4,4'-bis(1-naphthylphenylamino)biphenyl (NPB). The electron blocking layer may be formed of BAlq, BCP, CF-X, 3-(4-t-butylphenyl)-4-phenyl-5-(4-biphenyl)-1,2,4-triazole (TAZ), or spiro-TAZ.

Moreover, the hole blocking layer may be formed of 2-(4-biphenyl)-5-(4-tert-butylphenyl)-1,3,4-oxydiazole (PBD), spiro-PBD, or TAZ. The electron transport layer may be formed of TAZ, PBD, spiro-PBD, Alq$_3$, BAlq, or SAlq. The electron injection layer may be formed of LiF, Ga complex, Liq, or CsF.

The second transfer layer 130 may be formed by thermal vacuum deposition, vapor phase deposition, spin coating, dip coating, doctor blading, or inkjet printing.

A gas generation layer (not shown) may be further provided between the light-to-heat conversion layer 110 and the first transfer layer 120. The gas generation layer absorbs light or heat transmitted from the light-to-heat conversion layer 110 and causes a decomposition reaction to discharge nitrogen gas or hydrogen gas, thus providing transfer energy. The gas generation layer may be made of pentaerythritol tetranitrate (PETN) or trinitrotoluene (TNT).

Figure 2A:
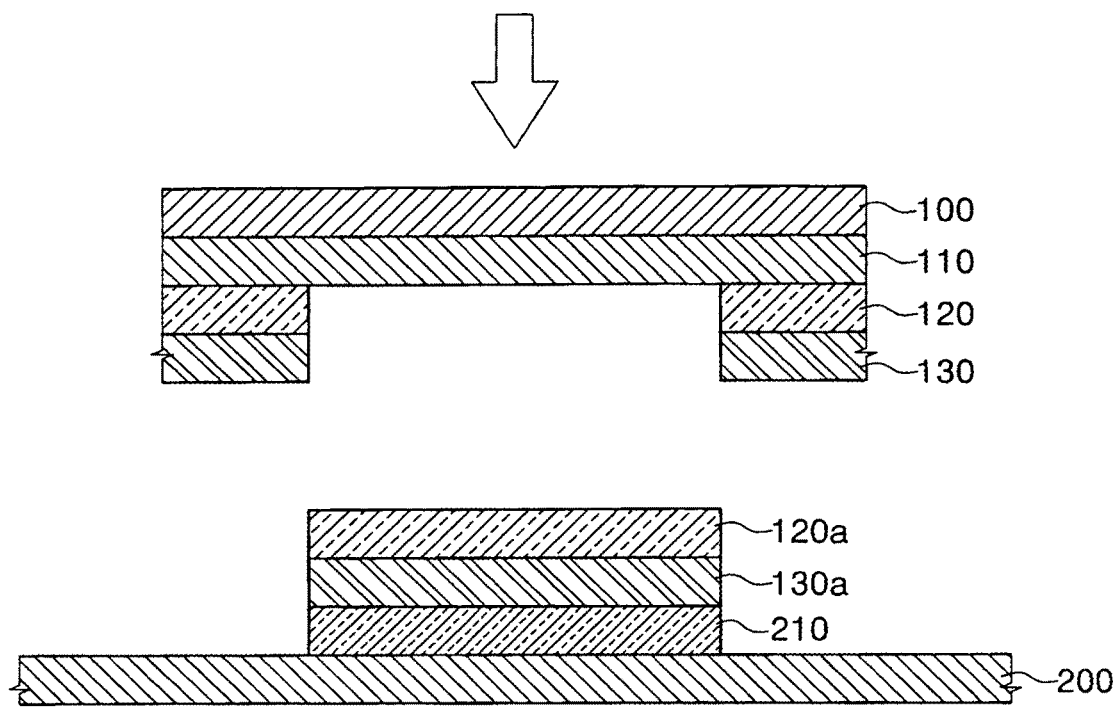
FIGS. 2A and 2B are cross-sectional views illustrating a process of fabricating an organic layer including an emission layer of an organic light emitting diode by laser induced thermal imaging (LITI) using the donor substrate for LITI according to the exemplary embodiment of the present invention.
Figure 2B:
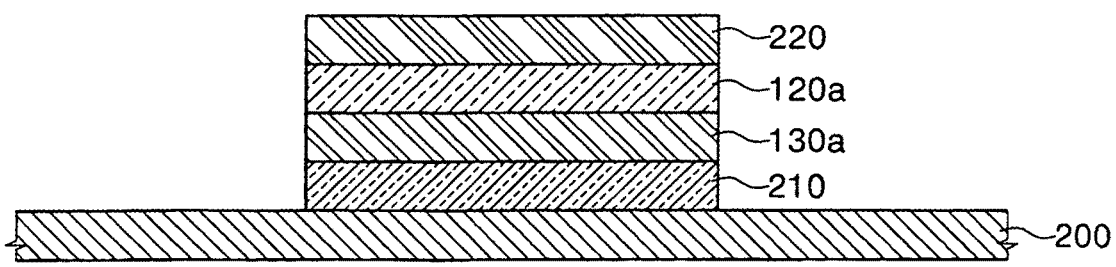

FIGS. 2A and 2B are cross-sectional views illustrating a process of fabricating an organic layer including an emission layer of an organic light emitting diode by laser induced thermal imaging (LITI) using the donor substrate for LITI according to the exemplary embodiment of the present invention. FIG. 4 is a flowchart showing the steps of the fabricating a donor substrate and steps of transferring a first transfer layer of the donor substrate onto a first electrode-formed substrate according to the present invention.

Referring to FIGS. 2A and 4, a first electrode 210 is formed on a substrate 200 (S410). The substrate 200 may be formed of a material such as glass, plastic or stainless steel. A thin film transistor (not shown) including a semiconductor layer, a gate electrode, and source/drain electrodes may be further formed on the substrate 200. The thin film transistor is electrically connected to the first electrode 210.

The first electrode 210 may be an anode and may be a transparent electrode or a reflective electrode. In the case where the first electrode 210 is a transparent electrode, it may be formed of indium tin oxide (ITO), indium zinc oxide (IZO), tin oxide (TO), or zinc oxide (ZnO). Otherwise, in the case where the first electrode 210 is a reflective electrode, it may have a structure that includes a reflective layer and a transparent layer stacked on the reflective layer. The reflective layer can be formed of a material including silver (Ag), aluminum (Al), chromium (Cr), molybdenum (Mo), tungsten (W), titanium (Ti), gold (Au), palladium (Pd) or an alloy layer thereof. The transparent layer can be formed of a material including ITO, IZO, TO or ZnO. The first electrode 210 may be formed by sputtering, vapor phase deposition, ion beam deposition, electron beam deposition, or laser ablation.

A donor substrate, which includes a base layer 100, a light-to-heat conversion layer 110, a first transfer layer 120, and a second transfer layer 130, is separately prepared. A light-to-heat conversion layer 110 is formed on a base layer 100 (S401). A first transfer layer 120 is deposited on the light-to-heat conversion layer 110 (S402). Finally, a second transfer layer 130 is formed on the first transfer layer 120 (S403), completing a donor substrate.

Subsequently, a donor substrate including the base layer 100, the light-to-heat conversion layer 110, the first transfer layer 120, and the second transfer layer 130 having the emission layer is positioned such that the second transfer layer 130 and the substrate 200 face each other (S411).

Next, a laser beam emitted from a laser source is applied onto a predetermined region of the base layer 100 of the donor substrate so that predetermined regions of the second transfer layer 130 and the first transfer layer 120, which are formed on the predetermined region of the base layer 100, are delaminated from the light-to-heat conversion layer 110, and are transferred onto the substrate 200, thus forming a second transfer layer pattern 130a and a first transfer layer pattern 120a on the first electrode 210 (S412). When transferring the second transfer layer pattern 130a including the emission layer, the first transfer layer pattern 120a is transferred at the same time. Accordingly, it is possible to prevent the emission layer from being damaged by heat, and it is thus possible to prevent wrinkles from occurring on the interface of the emission layer. Moreover, it is possible to control the difference in transfer characteristics, which depends on the kind of materials used to form the emission layer, by simultaneously transferring the first transfer layer pattern 120a, and it is thus possible to select various materials used to form the emission layer.

Since the first transfer layer pattern 120a includes an organic layer, an inorganic layer, or a double layer thereof, which has an absolute value of LUMO energy level of 2.6 to 3.0 eV and a band gap energy of 2.8 to 3.4 eV, the first transfer layer pattern 120a can control the transfer of electric charges injected into the emission layer at low brightness for displaying black in the OLED, thus preventing the OLED from emitting light.

Next, referring to FIGS. 2B and 4, a second electrode 220 is formed on the first transfer layer pattern 120a to complete the fabrication of the OLED (S413). The second electrode 220 may be a cathode and may be a transparent electrode or a reflective electrode. In the case where the second electrode 220 is a transparent electrode, it may be formed of a thin layer of a material selected from the group consisting of Mg, Ca, Al, Ag, and an alloy thereof, which are conductive metals having a low work function, to have a small thickness that light can transmit. Otherwise, in the case where the second electrode 220 is a reflective electrode, the layer of the material described above may be formed to have a large thickness so that the thick layer reflects light. The second electrode 220 may be formed by sputtering, vapor phase deposition, ion beam deposition, electron beam deposition, or laser ablation.

Moreover, before forming the second transfer layer pattern 130a including the emission layer and the first transfer layer pattern 120a on the first electrode 210 by LITI, at least one of a hole injection layer, a hole transport layer, an electron blocking layer, a hole blocking layer, an electron transport layer, and an electron injection layer may be formed on the first electrode 210 by spin coating or thermal vacuum deposition.

Meanwhile, according to the present embodiment, the first transfer layer 120 including an organic layer, an inorganic layer, or a double layer thereof, which has an absolute value of LUMO energy level of 2.6 to 3.0 eV and a band gap energy of 2.8 to 3.4 eV, is delaminated from the donor substrate and transferred onto the substrate 200. However, it is possible to transfer only the second transfer layer 130 including the emission layer onto the donor substrate. In this case, the first transfer layer 120 serves as a buffer layer on the donor substrate, not as the transfer layer. Even in this case, since the buffer layer is a material having a large steric hindrance, a conglomerate phenomenon does not occur during transfer and it is thermally stable. Therefore, it is possible to prevent the emission layer from being damaged by heat during the transfer process, and it is thus possible to prevent wrinkles from occurring on the surface of the emission layer. Moreover, it is possible to control the difference in transfer characteristics depending on the kind of materials used to form the emission layer, and it is thus possible to select various materials used to form the emission layer.

The following examples are provided for a better understanding of the present invention; however, the present invention is not limited thereto.

COMPARATIVE EXAMPLE

A base layer was formed of polyethylene terephthalate, and a light-to-heat conversion layer including carbon black as a light absorbing material was formed on the base layer. A green emission layer including GGH01 (manufactured by Gracel) as a host material and GGD01 (manufactured by Gracel) as a dopant material was formed to a thickness of 200 Å on the light-to-heat conversion layer. A first hole transport layer was formed of NPB to a thickness of 300 Å on the green emission layer, thus preparing a donor substrate including a transfer layer having the emission layer.

A first electrode was formed of ITO on a glass substrate, and a hole injection layer was formed of IDE-406 (manufactured by Idemitsu) on the first electrode. Subsequently, a second hole transport layer was formed of NPB on the hole injection layer, thus preparing an acceptor substrate.

Then, the first hole transport layer formed on the donor substrate was positioned to face the acceptor substrate on which the first electrode was formed. A laser beam was applied onto a predetermined region of the base layer on the donor substrate to transfer predetermined regions of the green emission layer and the first hole transport layer onto the acceptor substrate.

EXPERIMENTAL EXAMPLE

A base layer was formed of polyethylene terephthalate, and a light-to-heat conversion layer including carbon black as a light absorbing material was formed on the base layer. A first transfer layer was formed of TC1558 (manufactured by Tetrahedron, LUMO: 2.93 eV; band gap energy: 2.96 eV) to a thickness of 50 Å on the light-to-heat conversion layer. A green emission layer including GGH01 (manufactured by Gracel) as a host material and GGD01 (manufactured by Gracel) as a dopant material was formed to a thickness of 200 Å on the light-to-heat conversion layer. A first hole transport layer was formed of NPB to a thickness of 300 Å on the green emission layer, thus preparing a donor substrate including a second transfer layer having the emission layer.

A first electrode was formed of ITO on a glass substrate, and a hole injection layer was formed of IDE-406 (manufactured by Idemitsu) on the first electrode. Subsequently, a second hole transport layer was formed of NPB on the hole injection layer, thus preparing an acceptor substrate.

Then, the first hole transport layer formed on the donor substrate was positioned to face the acceptor substrate on which the first electrode was formed. A laser beam was applied onto a predetermined region of the base layer on the donor substrate to transfer predetermined regions of the first transfer layer, the green emission layer and the first hole transport layer onto the acceptor substrate.

Figure 3A:
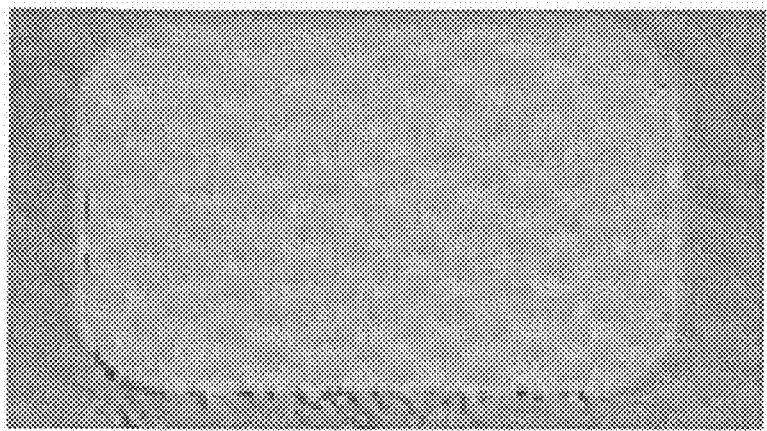
FIG. 3A is a photograph showing the surface of a green emission layer transferred by LITI using a donor substrate prepared according to a Comparative Example.
Figure 3B:
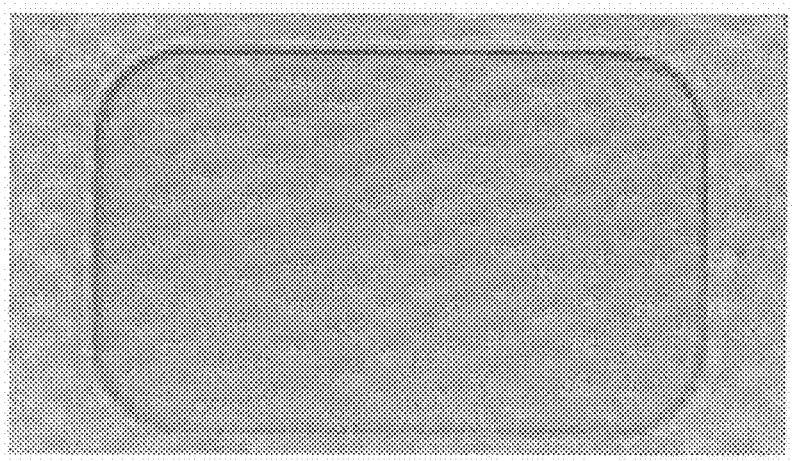
FIG. 3B is a photograph showing the surface of a first transfer layer transferred by LITI using a donor substrate of the present invention prepared according to an Experimental Example.

FIG. 3A is a photograph showing the surface of the emission layer transferred by LITI using the donor substrate prepared according to the Comparative Example, and FIG. 3B is a photograph showing the surface of the first transfer layer transferred by LITI using the donor substrate prepared according to the Experimental Example.

It can be seen from FIG. 3A that wrinkles were formed on the surface of the green emission layer transferred by LITI using the donor substrate prepared according to the Comparative Example. Meanwhile, it can be seen from FIG. 3B that the first transfer layer transferred by LITI using the donor substrate prepared according to the Experimental Example had a smooth surface without wrinkles. In the Experimental Example, since no wrinkles were formed on the surface of the first transfer layer, no wrinkles were present on the interface of the green emission layer located at the bottom of the first transfer layer.

As described above, it is possible to prevent a transferred emission layer from being damaged by heat and thus it is possible to prevent wrinkles from forming on the surface thereof by forming a first transfer layer or a buffer layer formed of an organic layer, an inorganic layer, or a double layer thereof, which has an absolute value of LUMO energy level of 2.6 to 3.0 eV and a band gap energy of 2.8 to 3.4 eV between an emission layer and a light-to-heat conversion layer. Moreover, the difference in transfer characteristics depending on the kind of materials used to form the emission layer is controlled by the first transfer layer or the buffer layer, and thus it is possible to select various materials used to form the emission layer.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A donor substrate for laser induced thermal imaging, comprising:
   a base layer;
   a light-to-heat conversion layer disposed on the base layer;
   a first transfer layer disposed on the light-to-heat conversion layer and including an organic layer, an inorganic layer, or a double layer of an organic layer and an inorganic layer, the first transfer layer having an absolute value of lowest unoccupied molecular orbital energy level of 2.6 eV to 3.0 eV and a band gap energy of 2.8 eV to 3.4 eV; and
   a second transfer layer disposed on the first transfer layer and including an organic light emitting host material.

2. The donor substrate of claim 1, wherein the organic layer of the first transfer layer includes an organic light emitting host material.

3. The donor substrate of claim 2, wherein the organic light emitting host material of the organic layer of the first transfer layer includes a blue light emitting host material.

4. The donor substrate of claim 2, wherein the organic light emitting host material of the organic layer of the first transfer layer includes one selected from the group consisting of 4,4'-bis(2,2'-diphenylvinyl)-1,1'-biphenyl (DPVB), spiro-DPVB, distyrylarylene (DSA), distyrylarylene derivatives, distyrylbenzene (DSB), distyrylbenzene derivatives, carbazole derivatives, and triarylamine derivatives.

5. The donor substrate of claim 1, wherein, if the first transfer layer includes the organic layer, the first transfer layer has a thickness of 30 Å to 300 Å.

6. The donor substrate of claim 1, wherein, if the first transfer layer includes the inorganic layer or the double layer of the organic layer and the inorganic layer, the first transfer layer has a thickness of 30 Å to 50 Å.

7. A donor substrate for laser induced thermal imaging, comprising:
   a base layer;
   a light-to-heat conversion layer disposed on the base layer;
   a first transfer layer disposed on the light-to-heat conversion layer and including an organic layer, an inorganic layer, or a double layer of an organic layer and an inorganic layer, the first transfer layer having an absolute value of lowest unoccupied molecular orbital energy level of 2.6 eV to 3.0 eV and a band gap energy of 2.8 eV to 3.4 eV; and
   a second transfer layer disposed on the first transfer layer and including an organic light emitting host material and an organic light emitting dopant material.

8. The donor substrate of claim 7, wherein the organic layer of the first transfer layer includes an organic light emitting host material.

9. The donor substrate of claim 8, wherein the organic light emitting host material of the organic layer of the first transfer layer includes a blue light emitting host material.

10. The donor substrate of claim 8, wherein the organic light emitting host material of the organic layer of the first transfer layer includes one selected from the group consisting of 4,4'-bis(2,2'-diphenylvinyl)-1,1'-biphenyl (DPVB), spiro-DPVB, distyrylarylene (DSA), distyrylarylene derivatives, distyrylbenzene (DSB), distyrylbenzene derivatives, carbazole derivatives, and triarylamine derivatives.

11. A method of fabricating an organic light emitting diode, comprising:
   providing a substrate on which a first electrode is formed;
   positioning a donor substrate, which includes a base layer, a light-to-heat conversion layer disposed on the base layer, a first transfer layer disposed on the light-to-heat conversion layer and including an organic layer, an inorganic layer, or a double layer of an organic layer and an inorganic layer, and a second transfer layer disposed on the first transfer layer and including an organic light emitting host material, the first transfer layer having an absolute value of lowest unoccupied molecular orbital energy level of 2.6 eV to 3.0 eV and a band gap energy of 2.8 eV to 3.4 eV, the second transfer layer facing the substrate;
   irradiating a predetermined region of the base layer of the donor substrate with a laser beam to transfer a predetermined region of the first transfer layer and a predetermined region of the second transfer layer, which are formed on the predetermined region of the base layer, onto the substrate; and
   forming a second electrode on the transferred first transfer layer.

12. The method of claim 11, wherein the organic layer of the first transfer layer includes an organic light emitting host material.

13. The method of claim 12, wherein the organic light emitting host material includes a blue light emitting host material.

14. The method of claim 12, wherein the organic light emitting host material includes one selected from the group consisting of 4,4'-bis(2,2'-diphenylvinyl)-1,1'-biphenyl (DPVB), spiro-DPVB, distyrylarylene (DSA), distyrylarylene derivatives, distyrylbenzene (DSB), distyrylbenzene derivatives, carbazole derivatives, and triarylamine derivatives.

15. The method of claim 11, wherein, if the first transfer layer includes the organic layer, the first transfer layer has a thickness of 30 Å to 300 Å.

16. The method of claim 11, wherein, if the first transfer layer includes the inorganic layer or the double layer of the organic layer and the inorganic layer, the first transfer layer has a thickness of 30 Å to 50 Å.

\* \* \* \* \*